United States Patent
Linoff

[11] Patent Number: 6,078,209
[45] Date of Patent: Jun. 20, 2000

[54] SYSTEM AND METHOD FOR CONTROLLED PERFORMANCE DEGRADATION IN ELECTRONIC CIRCUITS

[75] Inventor: Joseph D. Linoff, San Jose, Calif.

[73] Assignee: Xilinx, Inc., San Jose, Calif.

[21] Appl. No.: 09/114,379

[22] Filed: Jul. 13, 1998

[51] Int. Cl.[7] .......................... H03K 21/00; H03K 17/14
[52] U.S. Cl. .......................... 327/513; 327/101; 327/115
[58] Field of Search .................... 327/512, 513, 327/115, 117, 99, 407, 415, 378, 362, 101

[56] References Cited

U.S. PATENT DOCUMENTS

| | | | |
|---|---|---|---|
| 4,011,516 | 3/1977 | Heimbigner et al. | 327/114 |
| 4,015,208 | 3/1977 | Hammer et al. | 377/30 |
| 4,453,834 | 6/1984 | Suzuki et al. | 368/201 |
| 4,611,181 | 9/1986 | Fukumura et al. | 331/66 |
| 4,716,551 | 12/1987 | Inagaki | 365/222 |
| 5,117,206 | 5/1992 | Imamura | 331/158 |
| 5,448,193 | 9/1995 | Baumert et al. | 327/156 |
| 5,485,127 | 1/1996 | Bertoluzzi et al. | 331/69 |
| 5,684,418 | 11/1997 | Yanagiuchi | 327/115 |
| 5,798,667 | 8/1998 | Herbert | 327/99 |
| 5,805,923 | 9/1998 | Shay | 395/828 |
| 5,821,781 | 10/1998 | Rigazio | 327/99 |
| 5,898,345 | 4/1999 | Namura et al. | 331/177 V |
| 5,923,197 | 7/1999 | Arkin | 327/262 |

*Primary Examiner*—Timothy P. Callahan
*Assistant Examiner*—Terry L. Englund
*Attorney, Agent, or Firm*—Lois D. Cartier

[57] ABSTRACT

A system and method for altering the effective operating frequency of an electronic system (e.g., an IC) in response to changes in temperature or current provides controlled and deliberate performance degradation. Reducing the effective operating frequency at high temperatures allows an IC to maintain a relatively stable power consumption. A first embodiment of the invention includes a temperature transducer, an Analog-to-Digital (A/D) converter, a select generator, and a clock frequency divider. The temperature transducer measures the temperature, which is converted by the A/D converter to a digital value. The digital temperature value drives the select generator, which generates one or more select signals. The select signals control the clock frequency divider to produce a clock signal with an effective clock frequency that depends on the measured temperature. According to a second embodiment of the invention, a current transducer is used instead of a temperature transducer.

20 Claims, 5 Drawing Sheets

SYSTEM AND METHOD FOR CONTROLLED PERFORMANCE DEGRADATION IN ELECTRONIC CIRCUITS

FIELD OF THE INVENTION

The invention relates to electronic systems including integrated circuits (ICs). More particularly, the invention relates to a system and method for deliberately degrading the performance of an electronic system in response to detected alterations in temperature or current, and novel circuits pertaining thereto.

BACKGROUND OF THE INVENTION

As ICs increase in size and speed with the development of the semiconductor industry, their use is affected by new factors that become progressively more limiting with increasing size. Two such factors are power consumption and operating temperature. Clearly, a large number of active gates consumes more power than a small number of active gates. Also, increasing speed (e.g., clock frequency) leads to greater power consumption because of the increased number of signal transitions per unit of time. This increase in power consumption not only reduces the usefulness of ICs in battery-powered systems, it also causes the temperature of the systems to increase, potentially to the point of affecting the system operation, or even damaging the IC or other hardware. Power consumption and temperature control are therefore important issues to IC and system designers.

Temperature sensors have previously been used in a limited fashion to reduce power consumption in ICs. Inagaki, in U.S. Pat. No. 4,716,551, entitled "Semiconductor Memory Device with Variable Self-Refresh Cycle", which is incorporated herein by reference, describes a semiconductor memory device with an internal refresh circuit. The memory device includes a timer circuit that generates two signals with different frequencies. One of these signals is selected to be used as a refresh request signal for the memory cells in the memory device. The signal with a shorter cycle is selected at a high temperature (i.e., when there is most leakage in the memory cells), and the signal with a longer cycle is selected at a low temperature (i.e., when there is less leakage in the memory cells). The optional use of the longer cycle refresh signal reduces power consumption in the memory device at low temperatures.

It is desirable to provide a more extensive and flexible system and method for reducing power consumption in ICs as a function of temperature. It is further desirable to obtain a finer control of power consumption than is provided by the two-state system of Inagaki.

SUMMARY OF THE INVENTION

The present invention provides a system and method for altering the effective operating frequency of an electronic system (e.g., an IC) in response to changes in temperature, thereby providing controlled and deliberate performance degradation. Reducing the effective operating frequency (i.e., effectively slowing down the clock) at high temperatures allows an IC to maintain a relatively stable power consumption. The term "effective frequency" is used herein to refer to the number of active edges in a specified repetitive time period. (The "effective frequency" of a clock may be the same as the "frequency", as the term is normally used, i.e., the reciprocal of the period between successive active edges of the clock.) Since the power consumption of an IC is proportional to the number of signals changing state in a specified time period, a lower effective frequency results in a lower power consumption.

A first embodiment of the invention includes a temperature transducer (temperature measurement device), an Analog-to-Digital (A/D) converter, a select generator, and a clock frequency divider. The temperature transducer measures the temperature, which is then converted by the A/D converter to a digital value. The digital value drives the select generator, which generates one or more select signals based on the digital value. The select signals control the clock frequency divider to produce a clock signal with an effective clock frequency that depends on the measured temperature.

The effective clock frequency may be related to the measured temperature in a non-linear fashion. The entire temperature range specified for the IC is divided into a plurality of temperature ranges. Optimal effective clock frequencies are established by experimentation or calculation for each temperature range. When the temperature rises or falls through the thresholds between the temperature ranges, the effective clock frequency is altered in response.

In one embodiment of the invention, only two temperature ranges are supplied. Whenever the temperature rises above the single threshold between the two temperature ranges, the circuit reduces the effective operating frequency of the IC and the temperature returns to a value below the single threshold. This embodiment is most useful in systems where the IC is the primary source of heat. In such systems, the effective operating frequency of the IC has a strong effect on heat in the system, and the circuit of the invention can keep the system temperature within a relatively small range of the single threshold.

According to another embodiment of the invention, a current transducer (current measurement device) is used instead of a temperature transducer. By measuring the voltage drop across a resistor on the IC and deriving the current, the relative power consumption can be established. (Other methods of measuring the current can also be used.) Power consumption is proportional to the square of the current. This embodiment of the invention therefore provides a more direct measurement of power consumption than an embodiment using a temperature transducer.

The system and method of the invention provide the advantage of precisely controlling the clock rate. Therefore, the invention can be used with asynchronous circuits as well as synchronous circuits. In other words, the invention can be used to alter the effective frequencies of asynchronous signals as well as clocks.

According to another aspect of the invention, a novel select generator and clock frequency divider are provided. The select generator described herein has an advantage over prior art select generators, because it allows N ranges to be specified for R data values, where N and R may be two unrelated integers. This capability allows a system designer to use a variety of scales for threshold analysis. The clock frequency divider described herein has an advantage over prior art clock frequency dividers, because it accepts an input clock having an input clock frequency and provides an output clock with an effective clock frequency of one of $1/N$, $2/N, \ldots, (N-1)/N, N/N$ times the input clock frequency, where N is an integer. These novel circuits are particularly well-suited to the described application of providing controlled and deliberate performance degradation in an IC.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

A controlled performance degradation circuit according to the invention is described. In the following description, numerous specific details are set forth to provide a more thorough understanding of the present invention. However, it will be apparent to one skilled in the art that the present invention may be practiced without these specific details.

Figure 1:
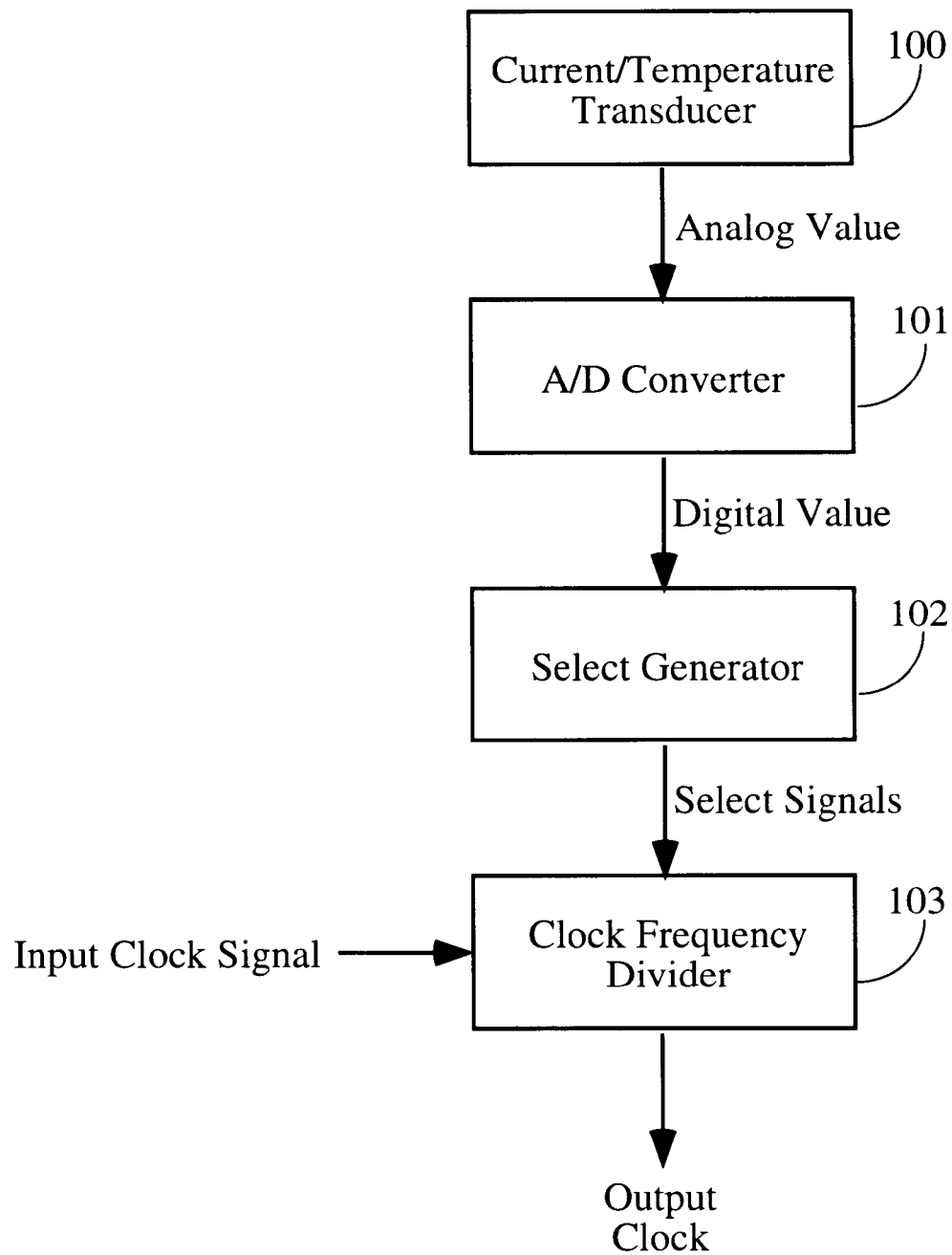
FIG. 1 shows a block diagram for the controlled performance degradation circuit of the invention.

FIG. 1 shows a block diagram of the system and method of the invention. The system includes either a current or a temperature transducer 100, an Analog-to-Digital (A/D) converter 101, a select generator 102, and a clock frequency divider 103.

If transducer 100 is a temperature transducer, it measures either the temperature of the IC itself (if implemented on the IC), or the temperature of the environment outside the IC (if implemented externally). An externally implemented temperature transducer is especially useful when the IC is used in unpredictable environments. Such an external temperature transducer can be implemented, for example, using a temperature-sensitive resistor element such as a thermistor. An internally implemented temperature transducer can be implemented, for example, as an MOS transistor having a temperature-sensitive threshold voltage. If transducer 100 is a current transducer, it measures the current through one or more transistors implemented in the IC. All of these types of transducers are well known in the art of IC and electronic system design.

Transducer 100 measures either a temperature or a current. In either case, the measured value is an analog value. Therefore, the value must be converted to a digital value. A/D converters are well-known in the art, and an A/D converter is easily implemented in an IC that includes the invention. Alternatively, an external A/D converter can be used. The resulting M-bit digital value for the temperature or current (where "M" is the number of bits of precision provided by the A/D converter) is then provided to select generator 102. Select generator 102 provides a P-bit select signal for clock frequency divider 103, which can generate from an input clock signal an output clock signal of a lower effective frequency.

Figure 2:
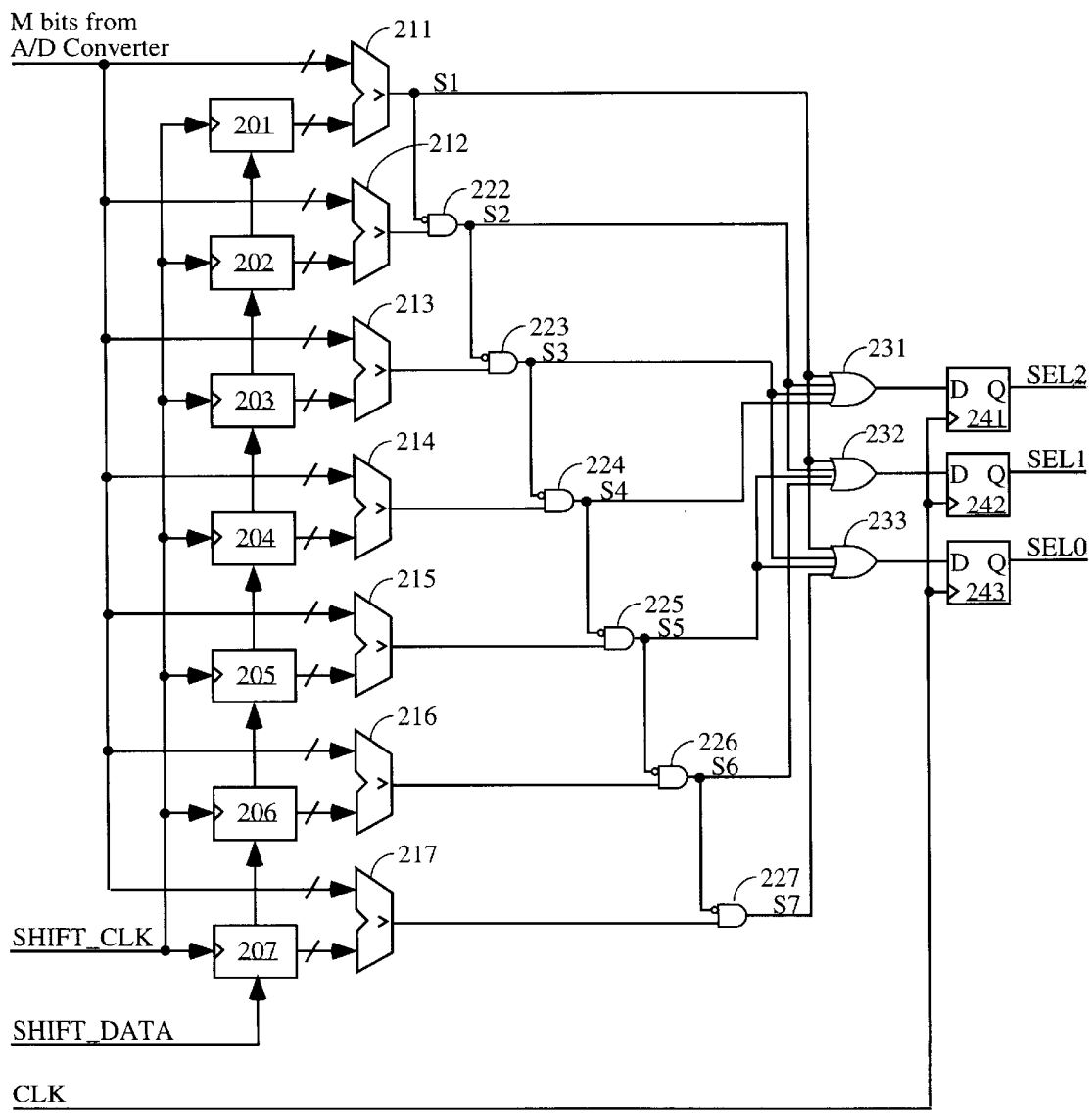
FIG. 2 shows a schematic diagram for a select generator used in one embodiment of the invention.

FIG. 2 shows a schematic for one embodiment of select generator 102. This select generator has an advantage over prior art select generators, because it allows N temperature ranges (where N is less than or equal to $2^P$) to be specified for R data values (where R is less than or equal to $2^M$), where N and R are two unrelated integers. This capability allows a system designer to use different scales for the select signals and the input signals. For example, there could be a linear relationship between successive thresholds for N, or a logarithmic scale could be used. In the embodiment of FIG. 2, N=8 and R is any integral value.

The select generator of FIG. 2 includes seven (N-1) M-bit shift registers 201-207 connected in series from 207 through 201 and clocked by signal SHIFT_CLK. The data input to shift register 207 is an input signal called SHIFT_DATA. The M-bit shift register output signals from shift registers 201-207 drive M-bit comparators 211-217, respectively, where they are compared to the M-bit input signals from the A/D converter. Comparators 212-217 drive AND-gates 222-227, respectively. In addition, AND-gates 223-227 are driven by the inverted output signals from AND-gates 222-226, respectively. AND-gate 222 is additionally driven by the inverted output of comparator 211. Comparator 211 and AND-gates 222-227 provide signals S1-S7, respectively. 4-Input OR-gate 231 is driven by signals S1, S2, S3, and S4. 4-Input OR-gate 232 is driven by signals S1, S2, S5, and S6. 4-Input OR-gate 233 is driven by signals S1, S3, S5, and S7. OR-gates 231-233 provide the data input signals to flip-flops 241-243, respectively, which are clocked by input signal CLK and provide select signals SEL2, SEL1, and SEL0, respectively, to the clock frequency divider.

Comparators 211-217 generate a high signal if the A/D value is greater than the shift register value, and generate a low value otherwise. The comparators therefore detect when the temperature passes a threshold between two temperature ranges having different assigned effective clock frequencies. For example, in the embodiment of FIG. 2, there are eight (N) temperature ranges, therefore there are seven (N-1) temperature thresholds. The digital values corresponding to the seven temperature thresholds are stored in shift registers 201-207, with the highest digital value stored in shift register 201. By comparing the M bits of data from the A/D converter to the M bits of predetermined data stored in shift register 201, comparator 211 detects when the temperature rises above the threshold value between temperature range "S2" and temperature range "S1", where temperature range "S1" is higher than temperature range "S2". (The temperature ranges are herein referred to by the same labels as the corresponding detection signals.)

Shift registers 201-207 can be loaded externally with threshold values for the temperature ranges, as in the embodiment of FIG. 2. In other embodiments, other methods are used to provide these values, such as hard-coding the values into the IC, or using read/write registers. In one embodiment supporting external loading of threshold values, a shift enable signal is provided to control when the shift registers are operational.

AND-gates 222-227 are included to guarantee that only the highest exceeded temperature range is reported. If the AND-gates were not present and the highest temperature range (S1) was reached, all of signals S2-S7 would also be high. In this embodiment, at most one of signals S1-S7 is high at a given time. If the M-bit digital value from the A/D converter is less than the value in shift register 207, none of signals S1-S7 is high.

OR-gates 231-233 convert the seven (N-1) signals S1-S7 to three (P) select signals, SEL2, SEL1, and SEL0.

Flip-flops 241-243 are optional. In this embodiment, they are used to synchronize select signals SEL2, SEL1, and SEL0 with the rest of the system, and to filter out noise.

One feature of this circuit is that signals S1-S7 and/or select signals SEL2, SEL1, and SEL0 can be used for purposes other than the controlled performance degradation circuit of the invention. For example, the signals can be used to speed up or slow down cooling fans, or to halt the system at predetermined temperatures in order to avoid physical damage. The circuit of FIG. 2 can also be used in other systems unconnected with temperature or power control.

Other select generators are used in other embodiments of the invention. For example, one select generator includes a single M-bit comparator that compares the M bits of data from the A/D converter to a value in an M-bit register. The value in the register is periodically updated with each of the shift register values in a rotating fashion. The comparator output drives the AND-gate corresponding to the currently selected shift register. Another select generator particularly suitable for use in Field Programmable Gate Arrays (FPGAs) uses a 4-bit lookup table, instead of a comparator, to interpret a 4-bit digital value (i.e., in this embodiment M=4). The lookup table is programmed to provide a high output when the digital value is greater than the threshold, and to provide a low output otherwise. For digital values having more than 4 bits (M>4), a RAM can be used in a similar fashion. In another embodiment, the select generator does not "encode" signals S1–S7 to generate select signals. Instead, signals S1–S7 are used as select signals.

Figure 3:
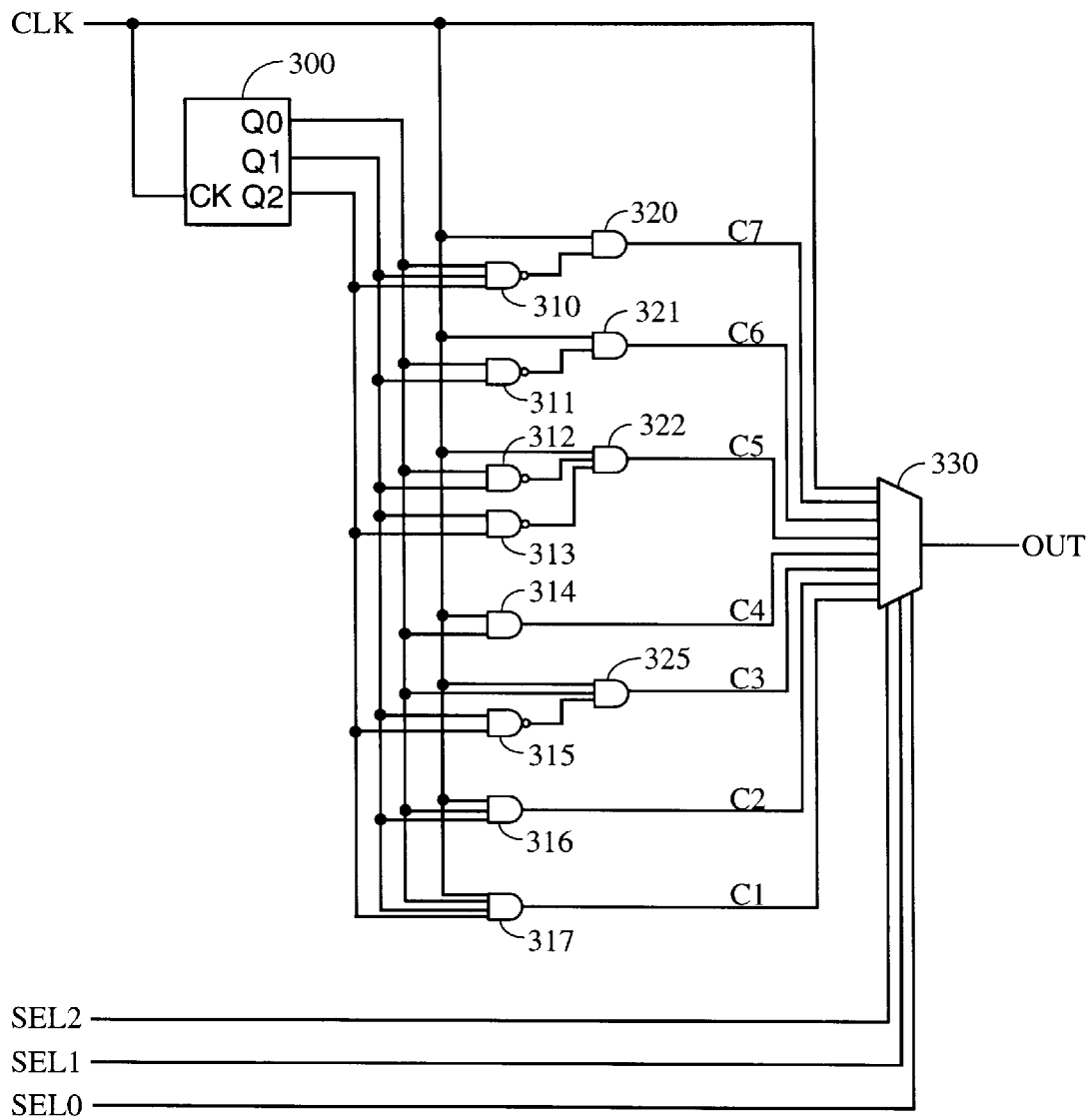
FIG. 3 shows an 8-bit clock frequency divider used in one embodiment of the invention.

FIG. 3 shows a schematic for one embodiment of clock frequency divider 103. This clock frequency divider has an advantage over prior art clock frequency dividers, because it accepts an input clock having an input clock frequency and provides an output clock with an effective clock frequency of 1/N, 2/N, . . . , (N−1)/N, N/N times the input clock frequency, where N is an integer. In the embodiment of FIG. 3, N=8; therefore, the clock frequency divider of FIG. 3 can be used with the select generator of FIG. 2.

The clock frequency divider of FIG. 3 includes a 3-bit (P=3) up-counter 300 providing counter bits Q0, Q1, and Q2, where Q0 is the least significant bit. Eight signals (CLK, C7, C6, . . . , C2, C1) are generated from the input clock CLK and counter bits Q0–Q2, as shown in Table 1. (In Table 1, the symbol "*" denotes an AND-function.) These eight signals are provided to an 8-to-1 multiplexer 330, which generates the output clock signal OUT. Multiplexer 330 is controlled by three select signals SEL2, SEL1, and SEL0, which are provided to the clock frequency divider by a select generator such as the one shown in FIG. 2. Table 2 shows the relationship between select signals SEL2, SEL1, and SEL0 and output clock signal OUT.

TABLE 1

| SIGNAL | FORMULA |
| --- | --- |
| CLK | CLK |
| C7 | CLK * NOT(Q0*Q1*Q2) |
| C6 | CLK * NOT(Q0*Q1) |
| C5 | CLK * NOT(Q0*Q1) * NOT(Q1*Q2) |
| C4 | CLK * Q0 |
| C3 | CLK * Q0 * NOT(Q1*Q2) |
| C2 | CLK * Q0 * Q1 |
| C1 | CLK * Q0 * Q1 * Q2 |

TABLE 2

| SEL2 | SEL1 | SEL0 | OUT |
| --- | --- | --- | --- |
| 0 | 0 | 0 | CLK |
| 0 | 0 | 1 | C7 |
| 0 | 1 | 0 | C6 |
| 0 | 1 | 1 | C5 |
| 1 | 0 | 0 | C4 |
| 1 | 0 | 1 | C3 |
| 1 | 1 | 0 | C2 |
| 1 | 1 | 1 | C1 |

Figure 4:
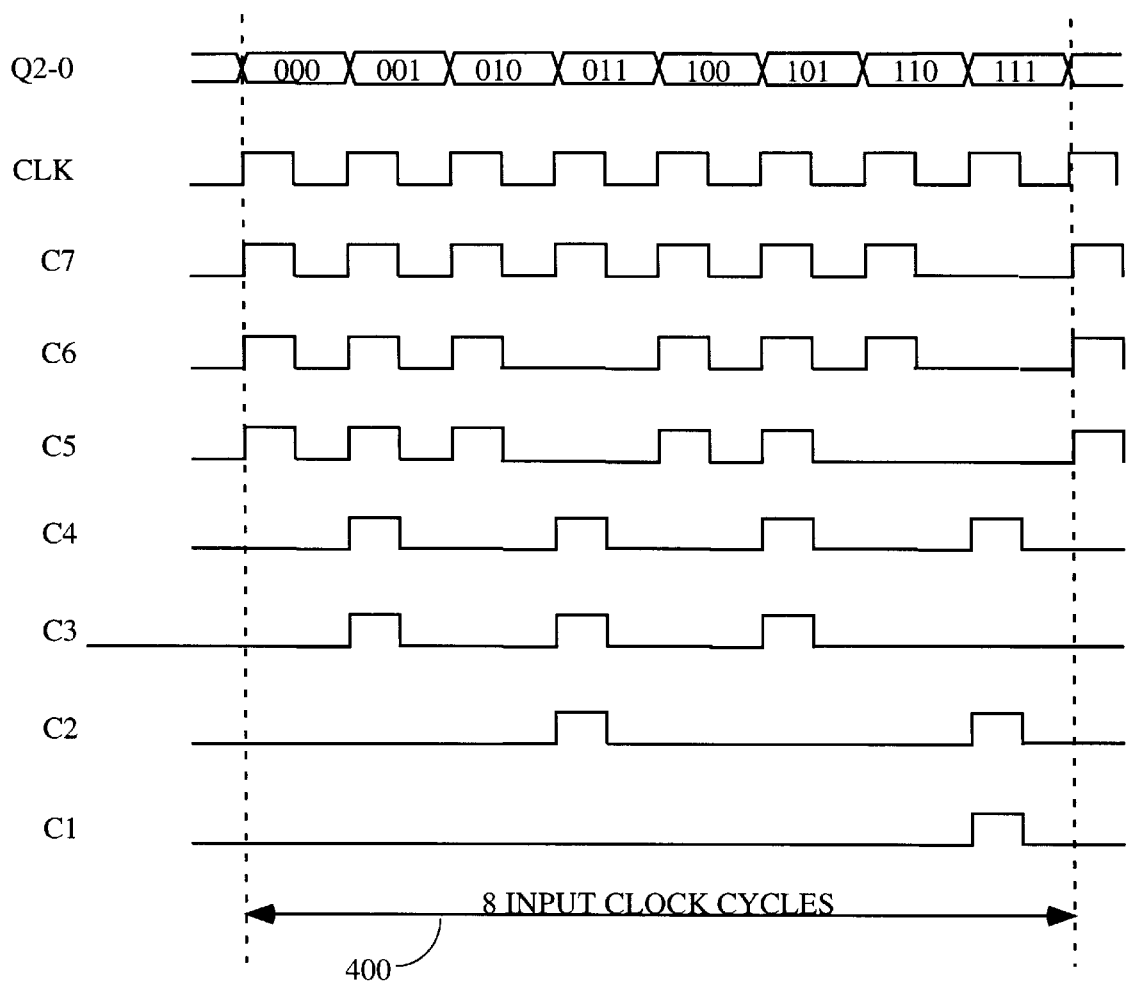
FIG. 4 shows a timing diagram for the clock frequency divider of FIG. 3.

FIG. 4 shows a timing diagram for the clock frequency divider of FIG. 3. The clock frequency divider divides the frequency asymmetrically by filtering out one or more of each N pulses on the input clock, as dictated by the select signals. Arrow 400 shows one time period including eight pulses on input clock signal CLK. Signal C7 filters out one of the pulses, retaining seven pulses. Therefore, the effective frequency of signal C7 is (N−1)/N, or ⅞, times the frequency of input clock signal CLK. Similarly, signal C6 retains six of each eight pulses, signal C5 retains five, and so forth.

The circuit of FIG. 3 can easily be modified to accommodate circuits where N has a value other than 8. For example, counter 300 can be modified to provide (P=log$_2$ N) output signals, where multiplexer 330 has N inputs and (P=log$_2$ N) select lines. Using values of N for which N is a power of two is most convenient for the multiplexer select logic and the counter, but other values of N can be used. When N is not a power of two, the number of counter output signals and select lines is the same as the number needed for the next larger power of two.

Exemplary Frequency Adjustment

An example of adjusting the effective operating frequency of an IC is now described, using an embodiment similar to that of FIGS. 1–4. In this example, the desired maximum case temperature for the packaged IC is 120° C. (degrees Centigrade), and the input clock frequency is 66 MHz (megahertz).

In this example, the temperature transducer and A/D converter are external to the IC. The temperature transducer is accurate to 1° C. over the range of 50° C. to 250° C., and is obtained from a commercial source. The A/D converter has a precision of 8 bits, and is also obtained from a commercial source. Such temperature transducers and A/D converters are well known in the art and are readily available.

An 8-bit A/D converter supplies 256 digital values. In this example, the temperature can vary from a minimum temperature of 120° C. up to a maximum temperature of 184° C., i.e., a difference of 64° C. Therefore, since six bits are sufficient to supply 64 digital values, the two least significant bits from the A/D converter are ignored. The shift registers and comparators in the select generator need only be six bits wide.

The non-linear temperature thresholds used are shown in Table 3. Approximate effective frequencies are also shown.

TABLE 3

| Temperature Range | No. Pulses Retained | Effective Frequency |
| --- | --- | --- |
| Up to 120° C. | 8 of 8 | 66 MHZ |
| 120° C. to 152° C. | 7 of 8 | 58 MHz |
| 152° C. to 168° C | 6 of 8 | 49.5 MHz |
| 168° C. to 176° C. | 5 of 8 | 41 MHz |
| 176° C. to 180° C | 4 of 8 | 33 MHz |
| 180° C. to 182° C | 3 of 8 | 25 MHz |
| 182° C. to 183° C. | 2 of 8 | 16.5 MHz |
| Over 183° C. | 1 of 8 | 8 MHz |

The select generator circuit is initialized by clocking in 42 bits of data through the shift registers. Each of seven shift registers contains six bits of data, comprising seven 6-bit threshold values. The seven threshold temperatures, as seen in Table 3, are 120° C., 152° C., 168° C., 176° C., 180° C., 182° C., and 183° C. Because 1° C. of precision is available, and because the temperature sensor starts at 50° C., the actual value reported by the A/D converter is offset by 50. Therefore, the seven threshold values for this example are 70, 102, 118, 126, 130, 132, and 133. These values are placed in shift registers 207–201, respectively.

Figure 5:
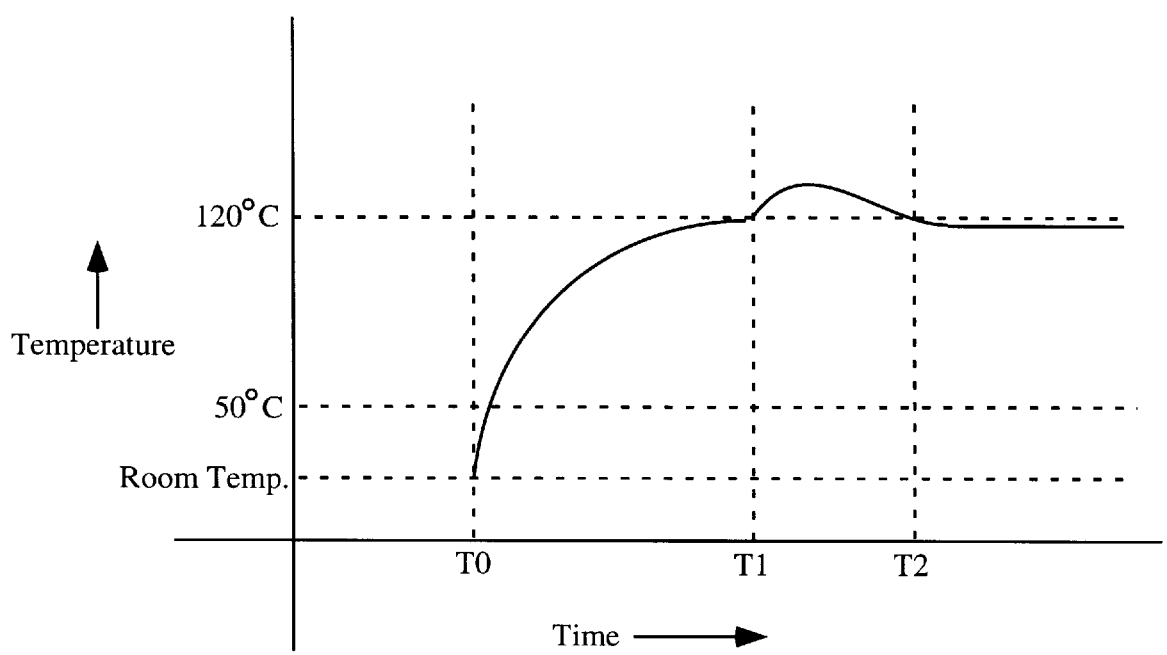
FIG. 5 shows a time versus temperature plot for an exemplary system having a controlled performance degradation circuit in accordance with the invention.

When the initialization is complete, the SHIFT_DATA and SHIFT_CLK pins can be reused and the temperature analysis begins. The following process is illustrated in FIG. 5.

At time T0 the system is activated. From time T0 to time T1, the system gradually warms up from below 50° C. to 120° C. During this period, the A/D converter reports a value less than or equal to "70". At time T1, an external source pumps heat into the system and the case temperature suddenly rises to 130° C. The A/D converter reports a digital value of "80". In response, the select generator (FIG. 2) detects that the digital value is over "70" (the value in shift register 207) and signal S7 goes high. The select signal values go to SEL2=0, SEL1=0, SEL0=1. As seen in Table 2, signal C7 is selected to provide the output clock signal. The performance degradation circuit of the invention removes one of every eight input clock pulses as shown in FIG. 4, reducing the operating frequency of the system from 66 MHz to about 58 MHz.

In the illustrated example, this alteration is sufficient to reduce the case temperature below the 120° C. temperature threshold, and the operating frequency returns to its original value at time T2. However, if the temperature remains above 120° C., the operating frequency remains at 58 MHz. If the temperature continues to rise, additional pulses are removed from the input clock in order to keep the temperature under control.

A system and method for deliberately altering the effective operating frequency of an electronic system have been described. Reducing the effective operating frequency at high temperatures allows an electronic system to maintain a relatively stable power consumption. Additionally, the system and method of the invention allow self-regulation of the temperature of an electronic system, since reducing the power consumption also leads to a drop in temperature.

Those having skill in the relevant arts of the invention will now perceive various modifications and additions which may be made as a result of the disclosure herein. For example, the invention is described with relation to an IC. However, the invention may also used in electronic systems other than ICs, or only partially comprising ICs. Accordingly, all such modifications and additions are deemed to be within the scope of the invention, which is to be limited only by the appended claims and their equivalents.

What is claimed is:

1. A circuit for altering the effective operating frequency of an electronic system in response to changes in temperature, the system having an associated temperature, the system further having an input clock signal, the circuit comprising:

a temperature transducer to sense and provide an analog temperature value representing the associated temperature;

an Analog-to-Digital (A/D) converter to convert the analog temperature value to a digital temperature value;

a select generator to generate one or more select signals in response to the digital temperature value; and a clock frequency divider to generate an output clock signal, the clock frequency divider generating a plurality of intermediate clock signals from the input clock signal, each of the plurality of intermediate clock signals being formed by eliminating a different number of pulses from the input clock signal, the output clock signal being selected by the one or more select signals from among the plurality of intermediate clock signals.

2. The circuit of claim 1, wherein the electronic system is an integrated circuit (IC) and the temperature transducer is an integral part of the IC.

3. The circuit of claim 1, wherein the electronic system is an integrated circuit (IC) and the temperature transducer is external to the IC.

4. The circuit of claim 1, wherein the output clock signal has an effective clock frequency that is related to the associated temperature in a non-linear fashion.

5. The circuit of claim 1, wherein:

the A/D converter provides one of R data values;

the output clock signal has any of N effective frequencies; and

R and N are two different integers.

6. The circuit of claim 1, wherein the clock frequency divider accepts the input clock signal having an input clock frequency and provides the output clock signal with an effective clock frequency of one of 1/N, 2/N, . . . , (N−1)/N, N/N times the input clock frequency, where N is an integer.

7. A circuit for altering the effective operating frequency of an electronic system in response to changes in current, the system having an associated current, the system further having an input clock signal, the circuit comprising:

a current transducer to sense and provide an analog current value representing the associated current;

an Analog-to-Digital (A/D) converter to convert the analog current value to a digital current value;

a select generator to generate one or more select signals in response to the digital current value; and a clock frequency divider to generate an output clock signal, the clock frequency divider generating a plurality of intermediate clock signals from the input clock signal, each of the plurality of intermediate clock signals being formed by eliminating a different number of pulses from the input clock signal, the output clock signal being selected by the one or more select signals from among the plurality of intermediate clock signals.

8. The circuit of claim 7, wherein the output clock signal has an effective clock frequency that is related to the associated current in a non-linear fashion.

9. The circuit of claim 7, wherein:

the A/D converter provides one of R data values;

the output clock signal has any of N effective frequencies; and

R and N are two different integers.

10. The circuit of claim 7, wherein the clock frequency divider accepts the input clock signal having an input clock frequency and provides the output clock signal with an effective clock frequency of one of 1/N, 2/N, . . . , (N−1)/N, N/N times the input clock frequency, where N is an integer.

11. A method of altering the effective operating frequency of an electronic system in response to changes in temperature, the system having an associated temperature, the system further having an input clock signal, the method comprising the steps of:

sensing an analog temperature value representing the associated temperature;

converting the analog temperature value to a digital temperature value;

generating one or more select signals in response to the digital temperature value;

generating a plurality of intermediate clock signals from the input clock signal, each of the plurality of intermediate clock signals being formed by eliminating a different number of pulses from the input clock signal; and generating an output clock signal by selecting one of the plurality of intermediate clock signals, the output clock signal being selected by the one or more select signals.

12. The method of claim 11, wherein the electronic system is an integrated circuit (IC) and the step of sensing an analog temperature value is carried out using a temperature transducer that is an integral part of the IC.

13. The method of claim 11, wherein the electronic system is an integrated circuit (IC) and the step of sensing an analog temperature value is carried out using a temperature transducer that is external to the IC.

14. The method of claim 11, wherein the output clock signal has an effective clock frequency that is related to the associated temperature in a non-linear fashion.

15. The method of claim 11, wherein:

the step of converting the analog temperature value to a digital temperature value provides one of R data values;

the output clock signal has any of N effective frequencies; and

R and N are two different integers.

16. The method of claim 11, wherein the clock frequency divider accepts the input clock signal having an input clock frequency and provides the output clock signal with an effective clock frequency of one of 1/N, 2/N, . . . , (N−1)/N, N/N times the input clock frequency, where N is an integer.

17. A method of altering the effective operating frequency of an electronic system in response to changes in current, the system having an associated current, the system further having an input clock signal, the method comprising the steps of:

sensing an analog current value representing the associated current;

converting the analog current value to a digital current value;

generating one or more select signals in response to the digital current value;

generating a plurality of intermediate clock signals from the input clock signal, each of the plurality of intermediate clock signals being formed by eliminating a different number of pulses from the input clock signal; and generating an output clock signal by selecting one of the plurality of intermediate clock signals, the output clock signal being selected by the one or more select signals.

18. The method of claim 17, wherein the output clock signal has an effective clock frequency that is related to the associated current in a non-linear fashion.

19. The method of claim 17, wherein:

the step of converting the analog current value to a digital current value provides one of R data values;

the output clock signal has any of N effective frequencies; and

R and N are two different integers.

20. The method of claim 17, wherein the clock frequency divider accepts the input clock signal having an input clock frequency and provides the output clock signal with an effective clock frequency of one of 1/N, 2/N, . . . , (N−1)/N, N/N times the input clock frequency, where N is an integer.

* * * * *